United States Patent [19]

Dorler

[11] 3,909,637

[45] Sept. 30, 1975

[54] CROSS-COUPLED CAPACITOR FOR AC PERFORMANCE TUNING

[75] Inventor: Jack A. Dorler, Wappingers Falls, N.Y.

[73] Assignee: International Business Machines Corporation, Armonk, N.Y.

[22] Filed: Nov. 21, 1974

[21] Appl. No.: 525,903

Related U.S. Application Data

[63] Continuation of Ser. No. 319,596, Dec. 29, 1972, abandoned.

[52] U.S. Cl. ................ 307/320; 307/208; 307/293; 307/303; 328/56; 357/14

[51] Int. Cl.² ...................... H03K 3/26; H01L 29/92

[58] Field of Search ........... 307/208, 293, 303, 320; 328/56; 357/14

[56] References Cited

UNITED STATES PATENTS

| | | | |
|---|---|---|---|
| 3,067,394 | 12/1962 | Zimmerman et al. | 357/14 |
| 3,138,743 | 6/1964 | Kilby | 357/51 |
| 3,753,010 | 8/1973 | Haraszti | 307/208 |
| 3,778,643 | 12/1973 | Jaffe | 357/14 |

*Primary Examiner*—Andrew J. James
*Assistant Examiner*—Joseph E. Clawson, Jr.
*Attorney, Agent, or Firm*—Sughrue, Rothwell, Mion, Zinn & Macpeak

[57] ABSTRACT

A method and apparatus for increasing the delays in transitions at controlled terminals in a non-linear integrated circuit by increasing the effective capacitance at the controlled terminals. This can be accomplished by capacitively cross-coupling at opposing phase controlled terminals. The capacitive cross-coupling is effected by connecting two P/N junction diodes in series with opposite directions of conductivity such that the capacitances across the junctions of the diodes are effectively connected in series.

1 Claim, 8 Drawing Figures

CROSS-COUPLED CAPACITOR FOR AC PERFORMANCE TUNING

This is a continuation of application of Ser. No. 319,596, filed Dec. 29, 1972, now abandoned.

BACKGROUND OF THE INVENTION

1. Field of the Invention

This invention relates to a method and apparatus for increasing delays in transitions in a non-linear integrated circuit having at least two controlled terminals of opposing phase and, more particularly, to capacitively cross-coupling the controlled terminals in the circuit in order to increase the effective capacitance without increasing the physical size of the capacitors.

2. Description of the Prior Art

Advances in the techniques of manufacturing integrated circuits have reduced the input capacitance to various individual transistors in the circuits, thus eliminating many problems with regard to delays in transitions in the circuits. However, in some circuits, delays in transitions are required, and they have been effected by connecting the controlled terminal of the transistor to AC ground through a capacitance, which produces the necessary delays. As the length of the delays are increased, the size of the capacitor must also increase and, as a practical matter, when delays reach certain values, it becomes difficult to make capacitors of the required size since the physical space in an integrated circuit is at a premium.

Furthermore, the capacitances which are connected between the controlled terminal and AC ground are subjected to voltages equal to the maximum voltage applied to the terminal, although the voltage swing at the terminal may be considerably less than the maximum voltage. In integrated design, consideration must be given to the method of constructing the capacitors to insure that they do not suffer electrical breakdowns.

SUMMARY OF THE INVENTION

It is the primary object of this invention to provide a method and apparatus for increasing the delays of transitions at the controlled terminals of a non-linear integrated circuit.

It is another object of this invention to provide capacitive cross-coupling between the opposing phase controlled terminals in a non-linear integrated circuit in order to increase the effect of the capacitance at these terminals.

It is still another object of this invention to serially connect two P/N junction diodes with opposite directions of conductivity between the two opposing phase controlled terminals in the non-linear integrated circuit such that the capacitances across the two junctions of the diodes are effectively connected in series between the two controlled terminals.

This invention is a method and apparatus for increasing the delays in transitions at the controlled terminals of a non-linear integrated circuit by connecting capacitances to the controlled terminals. The capacitances are cross-coupled between opposing phase controlled terminals so that the effective capacitance at each terminal is increased without increasing the physical size of the capacitor. Since this technique is used in integrated circuits, physical size of the element is a major concern.

The controlled terminals may be cross-coupled by connecting P/N junction diodes with opposite directions of conductivity in series between the controlled terminals. The capacitances across the two junctions form a series capacitance cross-coupling the two controlled terminals. The capacitance across each junction is voltage variable; however, since the two capacitances are connected in series, the effective capacitance is relatively stable.

DESCRIPTION OF THE PREFERRED EMBODIMENT

Figure 1:
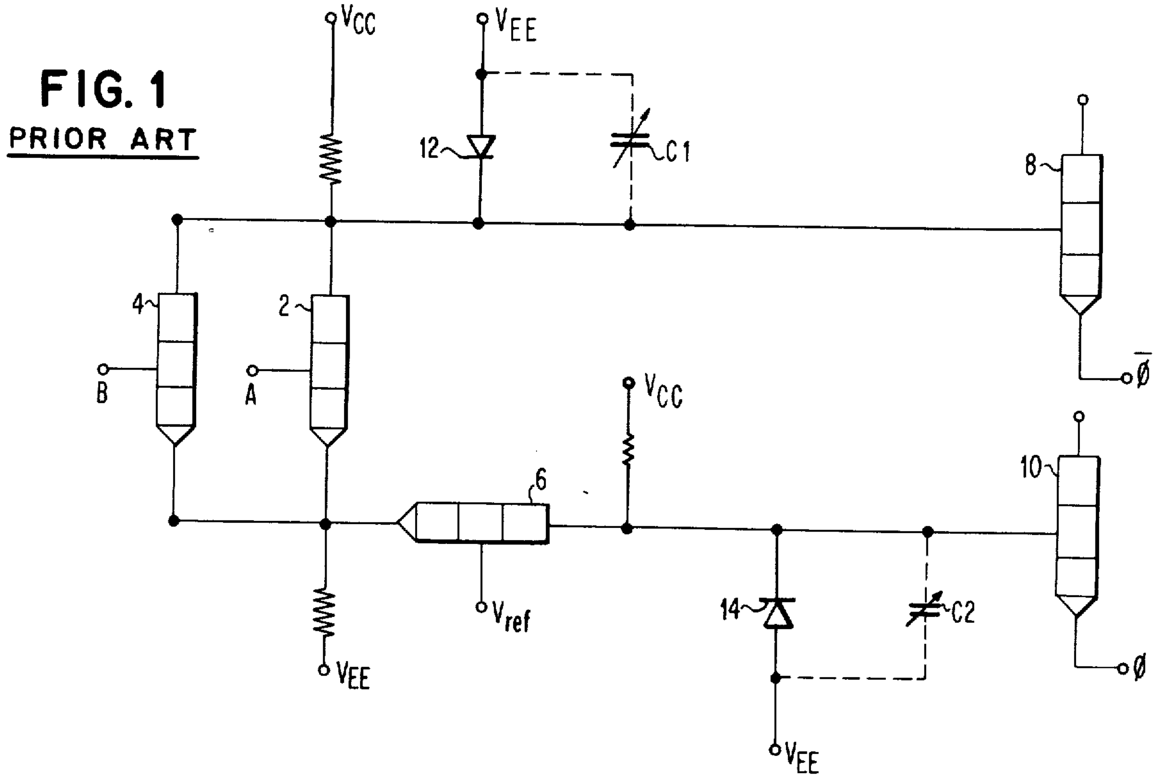
FIG. 1 PRIOR ART
FIG. 1 is a typical prior art non-linear integrated circuit.

FIG. 1 is a schematic diagram of a typical prior art non-linear integrated circuit having the controlled terminals of output emitter followers, each capacitively coupled to ground. Transistors 2 and 6, and 4 and 6, form current switches A and B respectively. The collector of transistors 2 and 4 is connected to the base of emitter follower 8, while the collector of transistor 6 is connected to the base of emitter follower 10. The base of emitter follower 8 is connected to $V_{EE}$ through a P/N junction diode 12, which has an effective capacitance Cl. The capacitance varies as a function of the voltage across the diode and it is effectively connected between the base of emitter follower 8 and $V_{EE}$ as shown in the figure. The base of emitter follower 10 is connected to $V_{EE}$ through a diode 14 having a capacitance C2 in a similar manner as the base of emitter follower 8 is connected to $V_{EE}$.

In operation, when a positive signal A is applied to the base of transistor 2, its collector goes negative, thus producing an output $\bar{\phi}$ at the emitter of emitter follower 8. The voltage waveform at the output of emitter follower 8 is a function of the base voltage and the rise time of the base voltage is a function of the capacitance Cl. Therefore, transition delays can be introduced at the output $\bar{\phi}$ by the proper selection of capacitance Cl. The longer the required delay, the greater capacitance Cl must be. Further, when the base of transistor 2 goes positive, the collector of transistor 6 goes positive, thus driving the base of emitter follower 10 positive and producing a positive going voltage $\phi$ at the output of emitter follower 10. The rise of the waveform at the output of emitter follower 10 is controlled by the capacitance C2 in the same manner as $\bar{\phi}$ is controlled by Cl.

Figure 2:
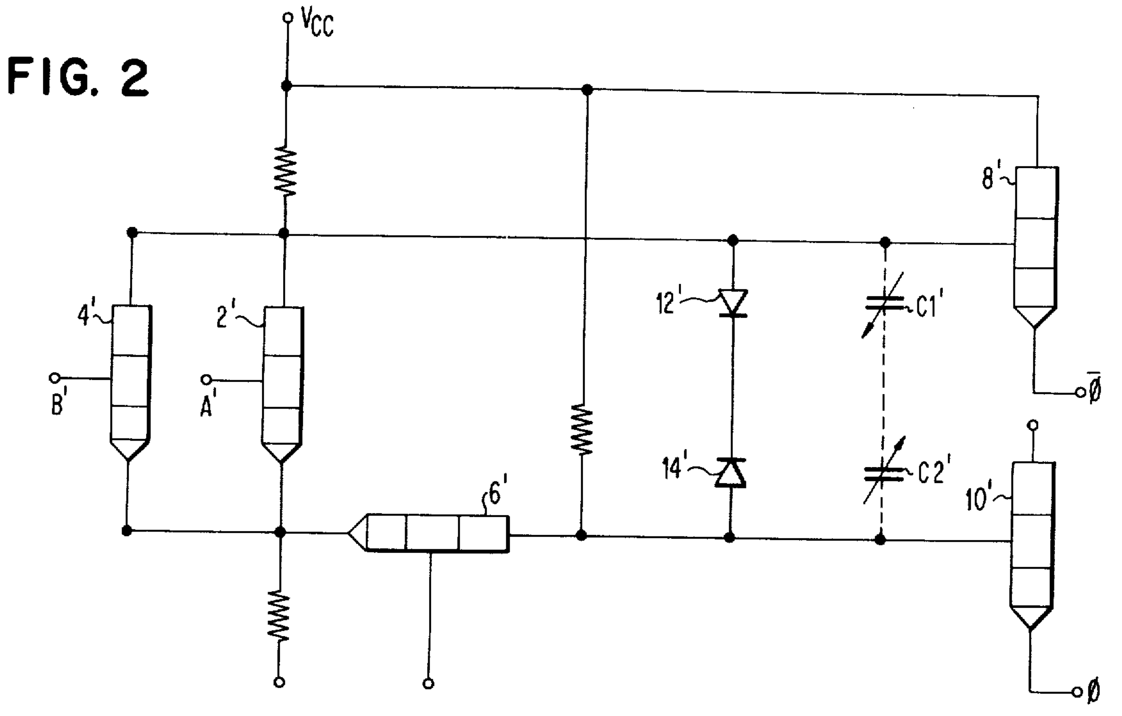
FIG. 2 is a non-linear integrated circuit incorporating the present invention.

FIG. 2 shows a circuit incorporating the present invention. The corresponding elements in FIG. 2 have the same numerals with a prime as those shown in FIG. 1. Current switches are formed by transistors 2' and 6' and 4' and 6', and the current switches are used to drive emitter followers 8' and 10' in the same manner as described above with respect to FIG. 1. In the circuit of the present invention, however, diode 12' and diode 14' are connected in series with opposite directions of conductivity, between the bases of emitter followers 8' and 10'. Connection in this manner effectively connects the capacitances across the junctions of the diodes, Cl' and C2', in series between the bases of the emitter followers 8' and 10'.

This circuit operates similarly to the operation of the circuit in FIG. 1. When a positive input signal A' is applied to the base of transistor 2', the collector of 2' goes negative and the collector of 6' goes positive. Looking at the voltage across the series capacitances Cl' and C2', while one terminal of Cl' is going negative, the terminal of C2' is going positive. This produces a greater dv/dt across the capacitance than that produced in the prior art. In the circuit of FIG. 1, for example, the voltage across capacitor C1 merely went negative, while the voltage across capacitor C2 went positive. In the circuit of FIG. 2, however, the voltage across the series capacitance goes negative on one side and positive on the other side at the same time, thus increasing the dv/dt and thereby effecting delays in the rise of the voltages at the base and thus the outputs of the emitter followers 8' and 10'.

As discussed above, in the prior art circuits such as FIG. 1, in order to increase the transition delays, there would have to be a corresponding increase in capacitances C1 and C2, which would require a corresponding increase in the physical size of diodes 12 and 14. Since size is a major consideration in integrated circuits, increasing the size to introduce the required delays is very impractical. However, by incorporating the present invention, the diodes 12' and 14' remain the same size as prior art devices 12 and 14 but the effective capacitance is greatly increased, thus increasing delays at the controlled terminals of emitter followers 8' and 10' without any increase in physical size in the integrated circuit.

Figure 3:
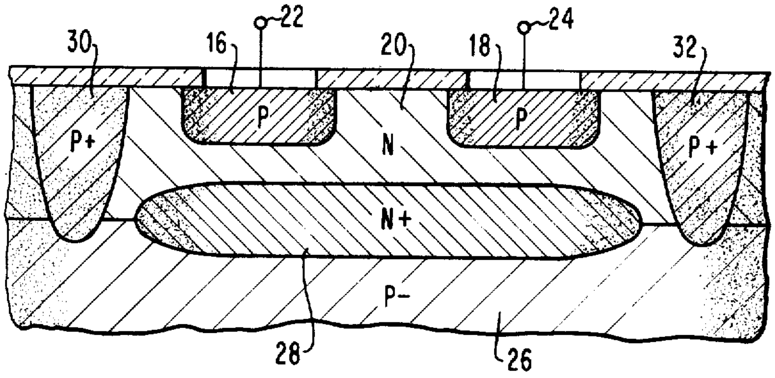
FIG. 3 is a cross-section of an integrated circuit showing two series connected diodes which can be used in the present invention.

FIG. 3 shows a cross-section through that portion of the integrated circuit including the two series connected, oppositively conductive diodes. One diode is formed by P region 16 and N region 20, while the other diode is formed by P region 18 and N region 20. A capacitance corresponding to capacitance Cl' exists across the junction between regions 16 and 20, and a capacitance corresponding to capacitance C2' exists across the junction between regions 18 and 20. The diodes and thus their effective capacitances may be connected in series through terminals 22 and 24. The diode is formed on a substrate 26 and has a barrier subcollector 28 between the diodes and the substrate in order to prevent PNP transistor action. Regions 30 and 32 provide isolation from the remaining portions of the integrated circuit on the substrate 26.

Figure 4:
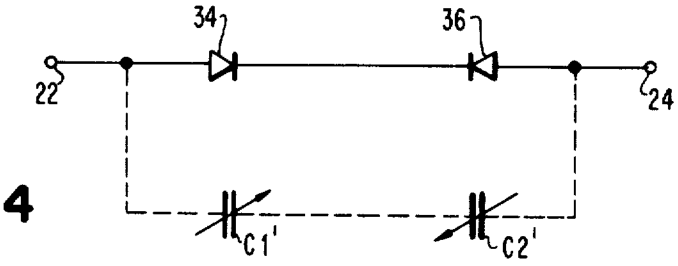
FIG. 4 is the equivalent circuit of FIG. 3.

FIG. 4 illustrates the equivalent circuit of the device shown in FIG. 3. Diode 34 corresponds to the diode formed by the junction of regions 16 and 20, while diode 36 corresponds to the diode formed by the junction of regions 18 and 20. The anode of diode 34 is connected to terminal 22 while the anode of diode 36 is connected to the terminal 24. Note that the diodes are connected in opposite directions of conductivity. The capacitances Cl' across the junction between regions 16 and 20, and the capacitance C2' across the junction between regions 18 and 20 exist in the circuit as is shown. The capacitances therefore are effectively a series capacitance between terminals 22 and 24.

Figure 5:
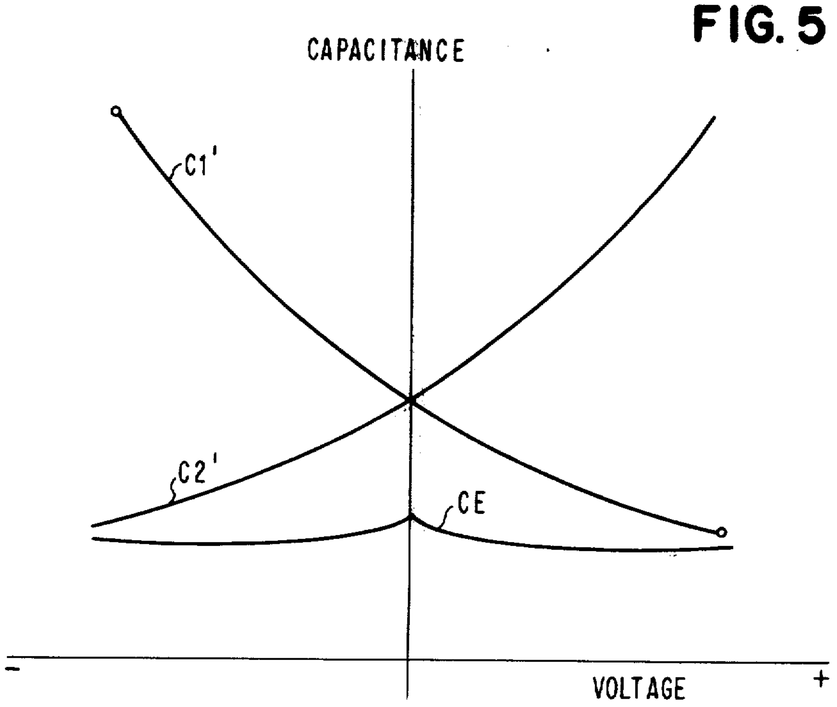
FIG. 5 shows the capacitance of the diodes of FIG. 3.

FIG. 5 shows the capacitances C1' and C2' as a function of voltage across the individual junctions and the effective capacitance CE between terminals 22 and 24. When the diode 34 is reverse biased, C1' is very small. As the bias is decreased, the capacitance decreases and as the diode becomes more and more forward biased, the capacitance steadily increases. It is readily apparent that the capacitance across the diode is a function of the voltage across the diode and varies greatly as the voltage changes. The capacitance of diode 36 is the same as that of diode 34. Since diode 36 is connected in the opposite direction, as the voltage at terminal 22 becomes more negative, diode 36 is effectively forward biased and thus its capacitance is high. However, as the voltage at terminal 22 goes more and more positive, the forward bias of diode 36 decreases and eventually it becomes reverse biased, thus decreasing the capacitance C2'. The effective capacitance CE between terminals 22 and 24, however, is relatively stable when compared to the individual capacitances. The effective capacitance CE is shown in FIG. 5. This capacitance is equal to $$\frac{(C1')\,(C2')}{C1' + C2'}.$$

It is readily apparent from the curves shown in FIG. 5, that the series capacitances used in the present invention provide a considerably more stable effective capacitance than individual capacitances used in the prior art. This eliminates to a great extent the voltage dependency of the capacitances.

Figure 6C:
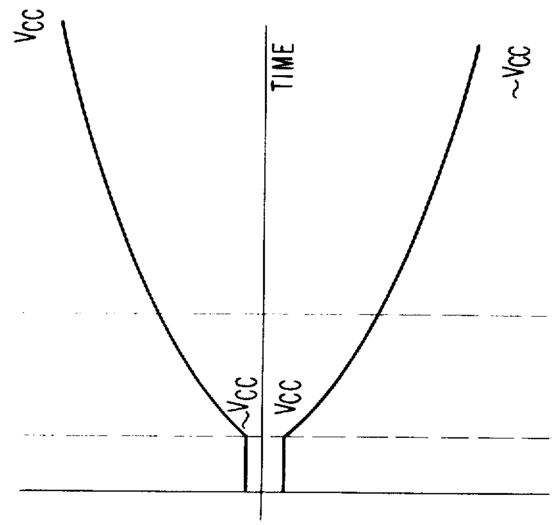
FIG. 6 shows the relationship of transitions in prior art circuits and the present invention.
Figure 6B:
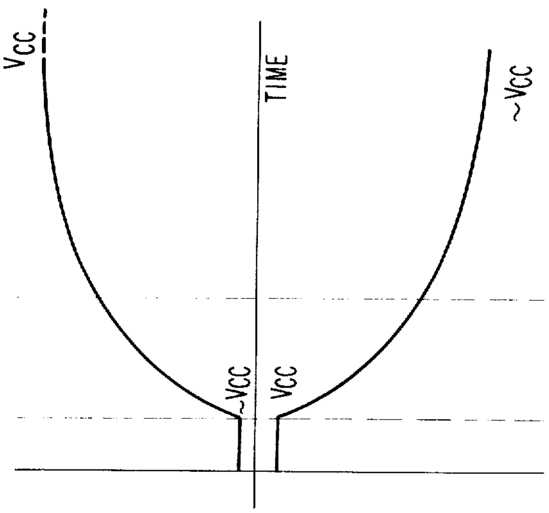
Figure 6A:
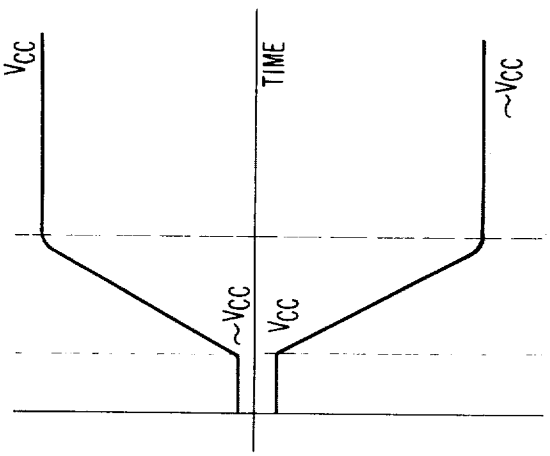

FIGS. 6A, B and C show voltage waveforms at the emitter follower outputs of integrated non-linear circuits which have no capacitance, a prior art capacitance and cross-coupled capacitance of the present invention, respectively. FIG. 6A shows a voltage waveform of a circuit having no capacitance connected to the base of the output emitter followers. Note the steep rise of the waveform, thus indicating a very short delay in the transition at the output. FIG. 6B illustrates a waveform at the output of the emitter follower using a capacitance such as that shown in the prior art FIG. 1. Note that the delay is greater than that shown in FIG. 6A but again the delay is relatively short and the waveform is relatively steep. FIG. 6C shows a waveform using the present invention by the incorporation of capacitively, cross-coupled bases for the output emitter followers. Note that the rise of the waveform is considerably more gradual and thus, greater delays are introduced. The introduced delays do not, however, require a greater physical size for the capacitances than the circuit shown in FIG. 1, which has an output shown in FIG. 6B. FIG. 6C clearly illustrates the additional delays gained by cross-coupling the bases of the emitter follower outputs without the necessity of increasing the physical size of the capacitances in the integrated circuit.

Another significant advantage of the circuit is the fact that the capacitances cross-coupling the bases merely sees the voltage swing between the bases and thus, if the swing is 1 volt, then the voltage across the capacitance is only 1 volt and not the maximum voltage to which the base rises. This eliminates problems in breakdown of the capacitances, such as that found n the prior art.

While the invention has been particularly shown and described with reference to the preferred embodiment thereof, it will be understood by those skilled in the art that various changes in form and details may be made therein without departing from the spirit and scope of the invention.

I claim:

1. A non-linear integrated circuit comprising at least one current switch having one input and two output terminals and producing opposite phase output signals on said two output terminals in response to a single polarity input signal at said input terminal, a first emitter follower having a base electrode connected to one of said two output terminals, a second emitter follower having its base electrode connected to the other of said two output terminals, capacitance means for delaying the transitions of said opposite phase output signals connected directly between said base electrodes of said first and second emitter followers, said capacitance means consisting of first and second voltage variable P/N junction capacitors connected in series with opposite directions of conductivity, said direct connection between said base electrodes of said series connected first and second voltage variable P/N junction capacitors producing a large dv/dt across said capacitance means due to said output signals being opposite in phase resulting in the effective capacitance seen by each of said output terminals being substantially greater than the capacitances of said first and second voltage variable P/N junction capacitors, and the capacitance of said capacitance means being substantially independent of voltage due to said first and second voltage variable P/N junction capacitors being connected with opposite directions of conductivity.

* * * * *